US005827365A

United States Patent [19]
Shimoyama et al.

[11] Patent Number: 5,827,365
[45] Date of Patent: Oct. 27, 1998

[54] COMPOUND SEMICONDUCTOR AND ITS FABRICATION

[75] Inventors: Kenji Shimoyama; Hideki Gotoh, both of Ushiku, Japan

[73] Assignee: Mitsubishi Kasei Corporation, Tokyo, Japan

[21] Appl. No.: 376,443

[22] Filed: Jan. 23, 1995

Related U.S. Application Data

[63] Continuation of Ser. No. 982,737, filed as PCT/JP92/00850 Jul. 6, 1992, abandoned.

[30] Foreign Application Priority Data

Jul. 5, 1991 [JP] Japan ................................ 3-190883

[51] Int. Cl.$^6$ .................................................. C30B 25/14
[52] U.S. Cl. ................................ 117/94; 117/89; 117/90; 117/104; 117/954
[58] Field of Search ................................ 117/104, 94, 89, 117/90, 954

[56] References Cited

U.S. PATENT DOCUMENTS

| | | | |
|---|---|---|---|
| 4,062,706 | 12/1977 | Ruehrwein | 156/610 |
| 4,147,571 | 4/1979 | Stringfellow et al. | 156/610 |
| 4,284,467 | 8/1981 | Loebner et al. | 156/DIG. 70 |
| 4,368,098 | 1/1983 | Manasevit . | |
| 4,504,331 | 3/1985 | Kuech et al. | 156/DIG. 104 |
| 4,578,127 | 3/1986 | Gossard et al. | 156/DIG. 61 |
| 5,036,022 | 7/1991 | Kuech et al. . | |
| 5,212,113 | 5/1993 | Azoulay et al. | 437/107 |

FOREIGN PATENT DOCUMENTS

| | | |
|---|---|---|
| A-0 477 096 | 3/1992 | European Pat. Off. . |
| 0 477 096 A1 | 3/1992 | France . |
| A-28 30 081 | 1/1979 | Germany . |
| 28 30 081 | 2/1979 | Germany . |
| A48-32470 | 4/1973 | Japan . |
| A51-882 | 1/1976 | Japan . |
| 01-175727 | 12/1987 | Japan . |
| B-51-014429 | 10/1989 | Japan . |

OTHER PUBLICATIONS

Bhat, Rajaram et al.; Vapor–Phase Etching and Polishing of Gallium Arsenide Using Hydrogen Chloride Gas, J. Electrochem Soc., vol. 122, No. 10, pp. 1378–1382 Oct. 1975.
Bhat, Rajaram; The Effect of Chloride Etching on GaAs Epitaxy Using TMG and $ASH_3$, J. Electrochem Soc., vol. 125, No. 5, pp. 771–776, May 1978.
VPE Processes for Gallium Arsenide, pp.250–257.
Patent Abstracts of Japan, vol. 11, No. 75 (C–408) Mar. 6, 1987, & JP–A–61232297 (NEC Corp.) Jun. 10, 1986 (Abstract).
Patent Abstracts of Japan, vol. 13, No. 453 (E–831) Oct. 11, 1989 & JP–A–01 175 727 (NEC Corp.) Jul. 12, 1989 (Abstract).
J. Appl. Phys. 50 6, (1979), pp. 4178–4183.
Vapor–Phase Etching and Polishing of Gallium Arsenide Using Hydrogen Chloride Gas; Rajaram Bhat et al., vol. 122, No. 10, Oct. 1975; pp. 1378–1381.
The Effect of Chloride Etching on GaAs Epitaxy Using TMG and $Ash_3$, Rajaram Bhat et al., May 1978, pp. 771–775.

*Primary Examiner*—Robert Kunemund
*Attorney, Agent, or Firm*—Armstrong, Westerman, Hattori, McLeland & Naughton

[57] ABSTRACT

A vapor phase growth process for the fabrication of a thin film form of compound semiconductor of elements of Groups III–V, using a halogen element-free hydride and a halogen element-free organic metal as the source materials for growth, is characterized in that a halide gas and/or a halogen gas that are free from the mother elements of the compound to be grown are added to the reaction atmosphere while the compound is growing. A trace amount(s) of the halide and/or halogen gas(es) that are free from the mother elements of the compound to be grown, such as HCl, is added to the reaction atmosphere while the compound is growing, thereby making it possible to flatten the heterojunction interface or effect the growth of high-quality crystals without deposition of polycrystals on a mask over a wide range.

15 Claims, 8 Drawing Sheets

COMPOUND SEMICONDUCTOR AND ITS FABRICATION

This application is a continuation of application Ser. No. 07/982,737, filed as PCT/JP92/00850, Jul. 6, 1992, now abandoned.

TECHNICAL FIELD

The present invention relates generally to a process for forming a compound semiconductor layer by the vapor phase growth of a thin film form of compound semiconductor starting from a hydride and an organic metal, and more particularly to a process for the fabrication of a compound semiconductor that lends itself well fit both for the flattening of the grown layer and for inhibiting deposition of polycrystals on a protective film for selective growth.

BACKGROUND TECHNIQUE

In order to improve the performance of compound semiconductor elements, quantum-effect devices and devices making use of two dimensional electron gases are now under vigorous development. For the fabrication of these devices, it is required to place growth rates under precise control, and this is usually achieved by using molecular beam epitaxial (MBE) and metal organic vapor phase epitaxial (MOVPE) growth techniques. Indeed, these epitaxial growth techniques are used to form heterojunction interfaces that are sharp at an atomic layer level. When these structures are applied to elements, the element properties are largely affected by the flatness of the heterojunction interfaces. For instance, an Al-containing compound interface is unsatisfactory in terms of flatness, because the migration length of the Al-containing compound molecules is short, offering some problems such as an electron mobility drop. In recent years, selective growth has been used to achieve an optimal device structure. However, since much difficulty is involved in achieving the selective growth by the MBE technique, the MOVPE technique is usually employed to this end. The selective growth process has a great advantage that a selective growth region of high quality and hence a high-performance element can be obtained, partly because it causes no damage to material and partly because it takes place at a relative low temperature.

However, the selective growth process is subject to some considerable restriction in terms of growth conditions, mol. fraction, mask width, etc., for inhibiting deposition polycrystal on a protective film. Especially in the case of an Al-containing compound, the higher the composition of Al and the larger the mask width, the more likely is the deposition of polycrystals on the protective film. This offers a problem that any desired device structure is unachievable.

An object of the present invention is to provide a process for the fabrication of a semiconductor having the heterojunction interface improved in terms of flatness and providing an device with excellent properties.

DISCLOSURE OF THE INVENTION

The inventors have made intensive and far-reaching investigations so as to provide a solution to the problems mentioned above, and have consequently accomplished the present invention on the basis of the finding that when forming the heterostructure of a compound semiconductor or attaining the selective growth of crystals, a halide gas and/or a halogen gas free from the mother elements of the compound to be grown is added to the reaction atmosphere, thereby making it possible to flatten the surface of the grown layer or attain the growth of high-quality crystals without deposition of polycrystals on a mask over a wide region. More specifically, the present invention provides a vapor phase growth process for fabricating a thin film of compound semiconductor by the use of a halogen element-free hydride and a halogen element-free organic metal as the source materials, said process being characterized in that a halide gas and/or a halogen gas that are free from the mother elements of the compound to be grown are added to the reaction atmosphere during the growth.

For the source materials for compound semiconductors used in the fabrication process of the invention, any desired materials may be used, with the proviso that they are ordinarily used hydrides and organic metals, all being free from halogen elements. In the invention, the halogen element-free hydrides used are generally arsine ($AsH_3$), phosphine ($PH_3$), and so on, and the halogen element-free organic metals used are generally trimethylgallium (TMG), triethylgallium (TEG), trimethylaluminum (TMA), trimethylindium (TMI), and so on.

In the invention, the halogen element-free source materials are used, as mentioned above, and this is because the use of halogenides of metals of Group III or V such as gallium chloride (GaCl), diethylgallium chloride (DEGaCl), and arsenic trichloride ($AsCl_3$) makes growth mechanism complicated, renders precise growth rate control difficult, causes a quartz tube to be subject to a corrosive attack in the case of the growth of Al-containing compounds, or offers other problems.

For the halide gas and/or halogen gas that are free from the mother elements of the compound to be grown, by way of example but not by way of limitation, use may be made of HBr, HI, HF, HCl, and $CCl_2F_2$ (for the halide gas) and $Cl_2$, $I_2$, $F_2$, and $Br_2$ or their mixtures (for the halogen gas). Notice that preference is given to HCl.

Figure 7:
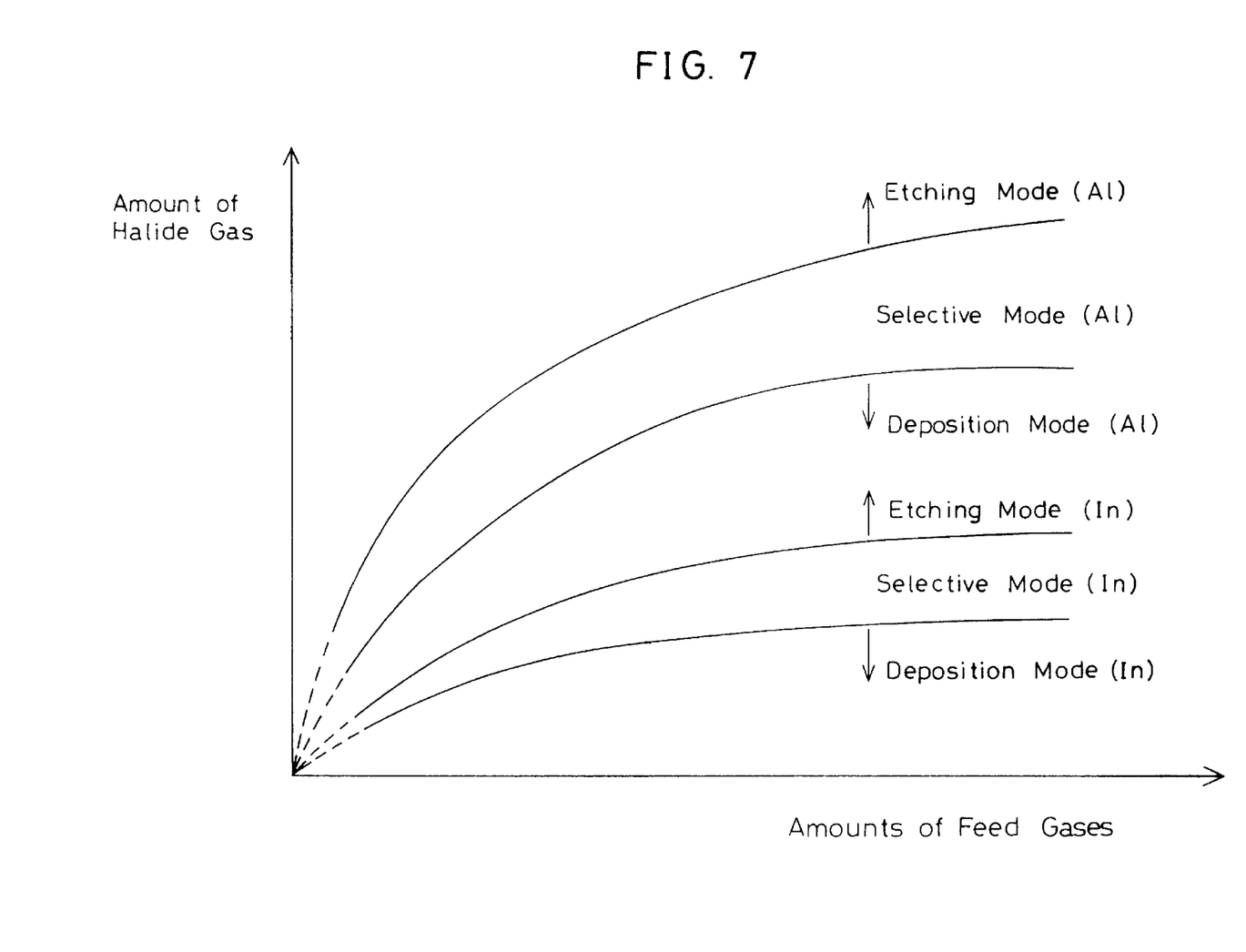
FIG. 7 illustrates the quantity of the halide gas and/or halogen gas used in the invention and the quantity of the halide element-free, feed gases used in the invention.

The quantity of the halide gas and/or halogen gas used, that are free from the mother elements of the compound to be grown, may vary largely depending on growth chamber size, growth temperature, etc., and may usually be smaller than the quantities of the halogen element-free organic metal. The quantitative relation between both the gases is then determined such that a selective mode wherein crystal growth takes place but no polycrystal is deposited on a mask, rather than an etching mode wherein no growth takes place and instead etching goes on and a deposition mode wherein polycrystals are deposited on a mask, is well established. FIG. 7 presents an illustration of how this is achieved in the case of aluminum and indium. Specific values of these quantities differ depending on growth chamber size, temperature, the source materials used, etc., as already noted, but those skilled in the art will be able to determine them optimally, with the equipment used in mind. It is here noted that low temperatures result in an etching rate reduction; in other words, at a low temperature, it is preferable to use the halide gas and/or halogen gas—that are free from the mother elements of the compound to be grown—in an increased amount.

Preferably, the total pressure of the gases fed in is at normal pressure or lower.

Growth temperature is not critical, if it lies within the temperature ranges ordinarily used for general vapor phase growth processes, and may generally lies within the range of about 500° to 800° C., preferably about 600° to 800° C.

Figure 8:
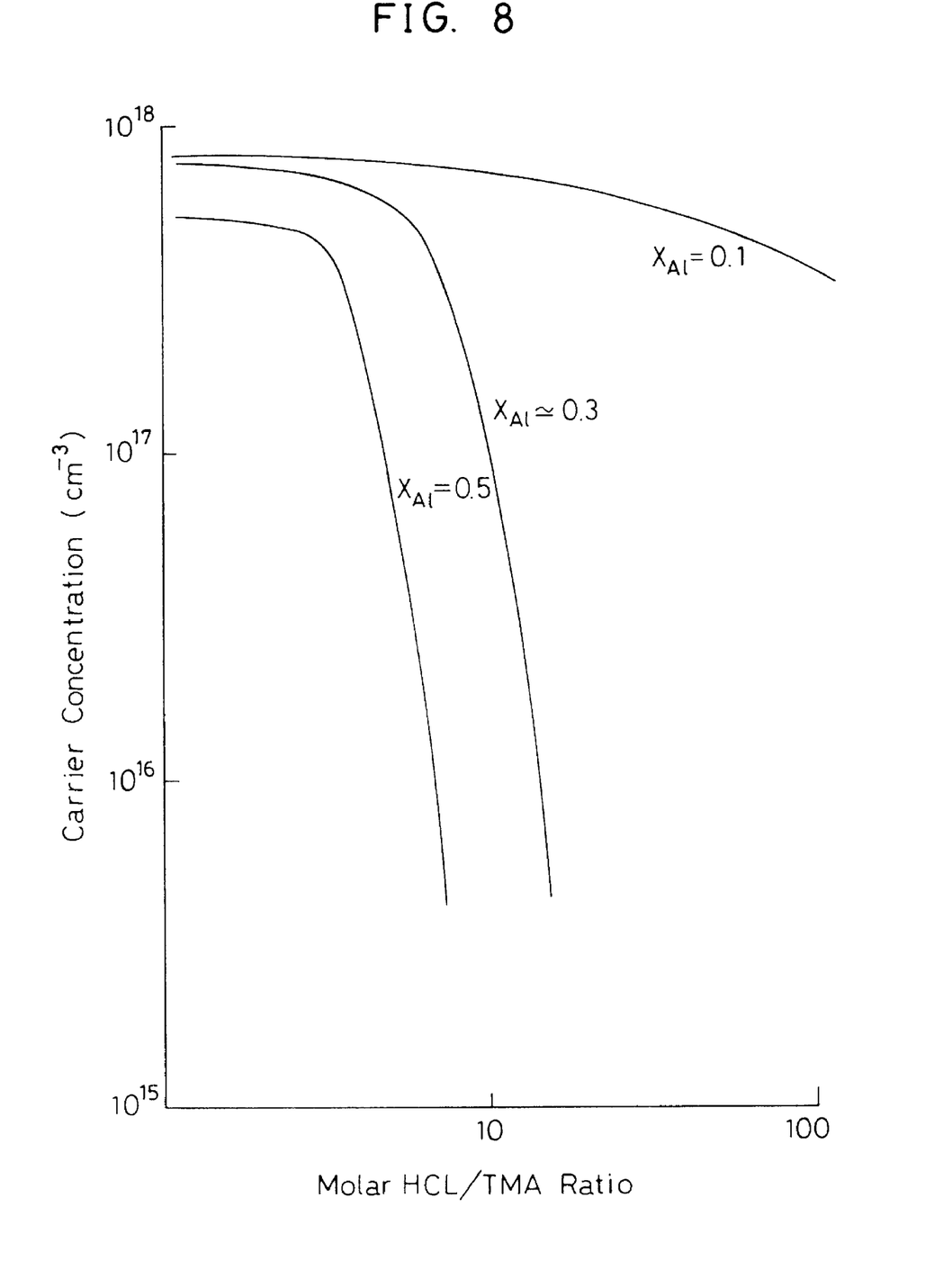
FIG. 8 illustrates the correlation between the molar ratio, R, of hydrogen chloride to triethylaluminum and the carrier concentration, found in Example 3, per molar aluminum ratio, $XA_1$, in the Group III elements in the Al-containing compounds Groups III–V.

The fabrication process of the invention is effective for the growth of thin semiconductor films of Group III–V compounds, and particularly favorable for the growth of thin semiconductor films of Al-containing Group III–V compounds of. More illustratively, the present fabrication process is well suited to the growth of AlInGaP, InAlAs, and AlInP, inter alia, AlGaAs. For the aluminum-containing starting gas, various well-known materials may be used. However, preference is given to using trialkylaluminum, because its reaction is relatively simple in mechanism, it decomposes to produce a gas with a plain behavior, and it is relatively inexpensive. Here, too, preference is given to using HCl as the halide gas and/or halogen gas. Preferably, the amounts of the trialkylaluminum and HCl fed into and used in a growth chamber are such chosen as to permit the molar (HCl/trialkylaluminum) ratio, R, to be 100 or lower. R exceeding 100 is not preferable, because it gives rise to some considerable growth rate reduction and, in some cases, may possibly cause the selective mode to pass into the etching mode. When the thin films of Al-containing Group III–V compounds are doped, it is preferable that the molar ratio R conforms to the following formulae:

when $[0 < X_{Al} \leq 0.2, R \leq 100]$ when $[0.2 < X_{Al} \leq 0.4, R \leq 50]$ when $[0.4 < X_{Al} \leq 1, R \leq 10]$ A departure of R from the range defined by Formulae I—that corresponds to the aluminum molar ratio $X_{Al}$ in the elements of Group III in the compounds of the elements of Groups III–V—is not preferable, because the carriers introduced by doping are likely to be inactivated. FIG. 8 represents the correlation between the molar ratio R and the carrier concentration when triethylaluminum and HCl were respectively used as the trialkylaluminum and the halide gas and/or halogen gas. FIG. 8, plotted on the basis of results of Example 3, teaches that the carrier concentration is largely affected by the molar ratio, $X_{Al}$.

Various well-known types of dopants may be used for the doping of the thin films of compounds of Group III–V according to the invention. The dopants, if they are incorporated in the side of Group III, help the present invention produce its own effect greatly, and this is particularly true of silicon and zinc. The effect of the present invention is particularly favorable for fabricating thin semiconductor films of Al-containing compounds Group III–V using silicon and zinc as the dopants.

According to the invention, a trace amount(s) of the halide gas and/or halogen gas—that are free from the mother elements of the compound to be grown—such as HCl is added to the reaction atmosphere during the growth. This enables the compound to be grown under conditions almost similar to those for conventional MOVPE techniques, making it possible to flatten the surface of the crystal film, improve surface morphology or the facets in terms of surface flatness, or effect the growth of high-quality crystals without deposition of polycrystals on a mask over a wide range.

BEST MODE FOR CARRYING OUT THE INVENTION

In the following description, the present invention will be explained with reference to some examples. It is understood, however, that the invention is not limited to them insofar as it does not depart from the purport.

Example 1

Figure 1:
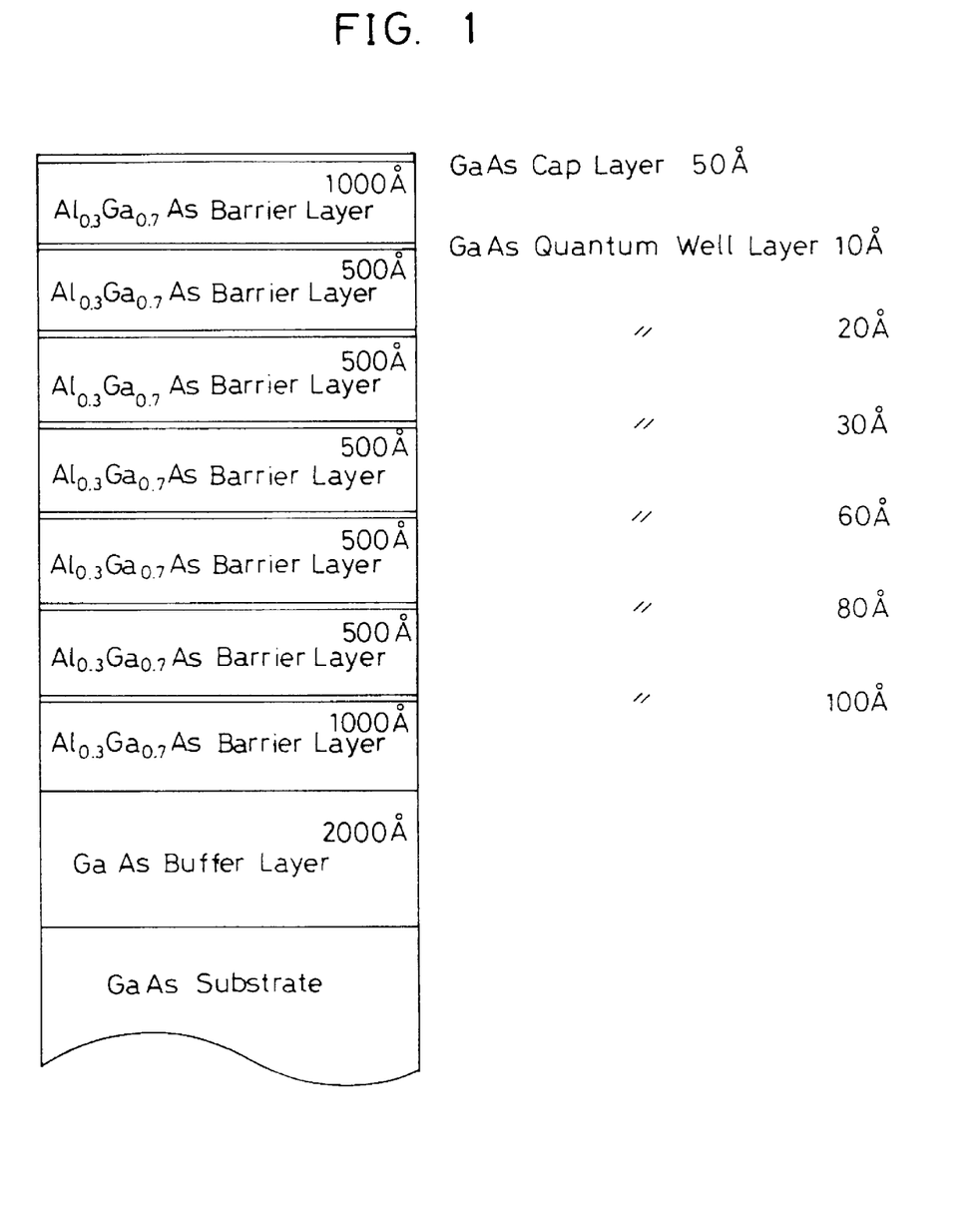
FIG. 1 is an illustration of the heterostructure used in Example 1.
Figure 2:
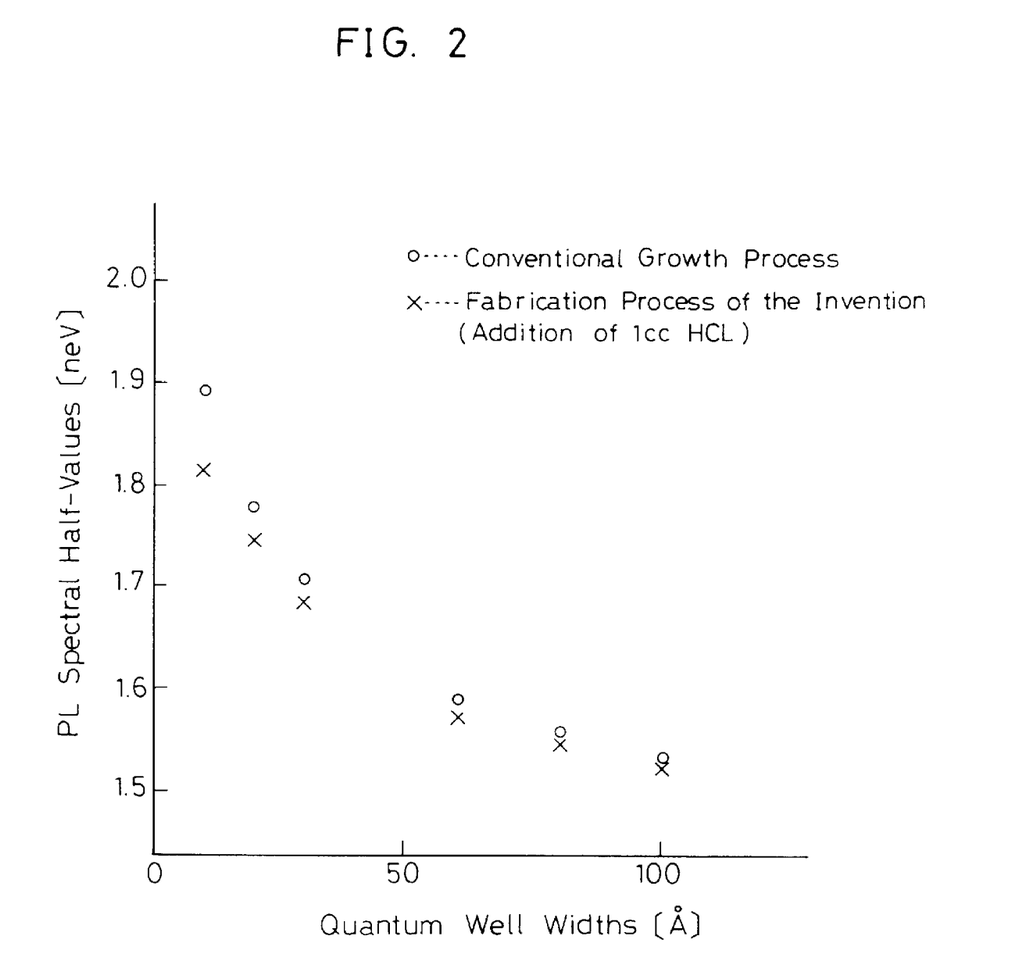
FIG. 2 represents the full width at the half maximum of the PL spectra of the products obtained by the fabrication process of the invention and a conventional process.

The MOVPE technique was used to fabricate a heterostructure including on a Cr-doped GaAs {100} substrate $Al_{0.3}Ga_{0.7}As$ barrier layers and six GaAs quantum wells having well widths of 10Å, 20Å, 30Å, 60Å, 80Å and 100Å, as illustrated in FIG. 1. The then used feed gases were trimethylgallium (TMG), trimethylaluminum (TMA) and arsine ($AsH_3$). The molar flow rates of TMG and TMA were $4.2 \times 10^{-5}$ mol/min respectively and $8.4 \times 10^{-6}$ mol/min, and the flow rate of 10% $AsH_3$ (diluted with $H_2$) was 800 sccm (standard cubic cm minute). The total flow rate was 7.7 SLM (standard liter minute), the growth temperature 650° C., the pressure 76 Torr and the growth rate about 1 $\mu$m/h. Under the above growth conditions, 1 cc of HCl was added to the reaction atmosphere during the growth of the $Al_{0.3}Ga_{0.7}$. As barrier layers to prepare Sample (A), and Sample (B) was prepared according to a conventional process making no use of HCl. Under the above growth conditions, the addition of 1 cc of HCl gave rise to a growth rate reduction, but this was barely 2%. These samples were measured at 4.2 K in terms of photoluminescence (PL) to observe light emissions from the quantum wells. The results of Samples (A) and (B) about PL measurement are shown in FIG. 2.

Both Samples (A) and (B) had an almost identical PL strength, but Sample (A) was much smaller in the full width at the half maximum of PL spectra as than Sample (B). The full width at the half maximum of PL spectra has a close relation to the flatness of the heterojunction interface at both ends of the quantum wells; in other words, the flatter the heterojunction interface, the smaller the full width at the half maximum of PL spectral is. From this, it is presumed that the migration of the Al-containing compound is enhanced by the addition of HCl, contributing to making the heterojunction interface much flatter.

Example 2

Figure 3:
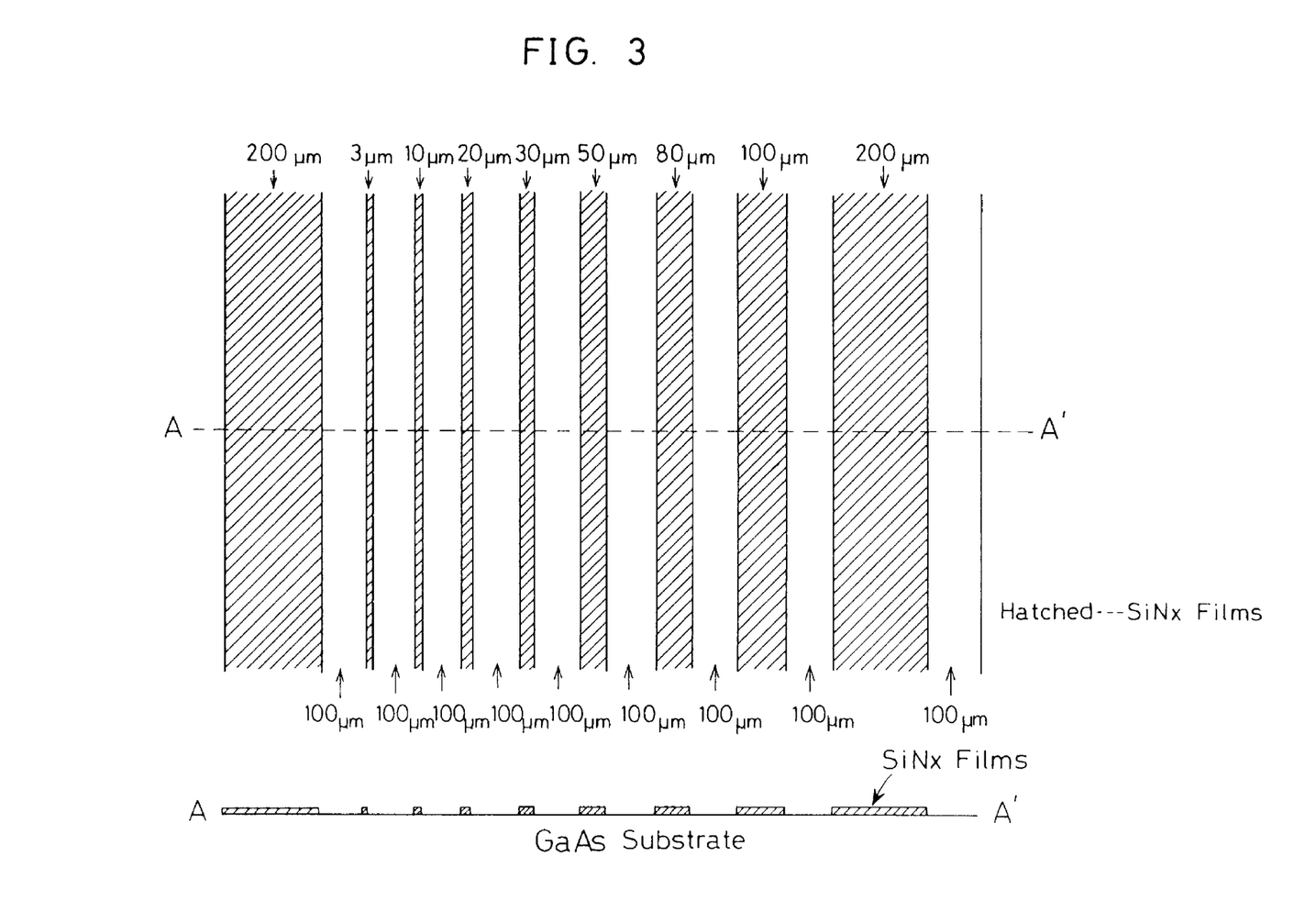
FIG. 3 represents a SiNx film stripe pattern on the GaAs substrate used in Example 2.
Figure 4:
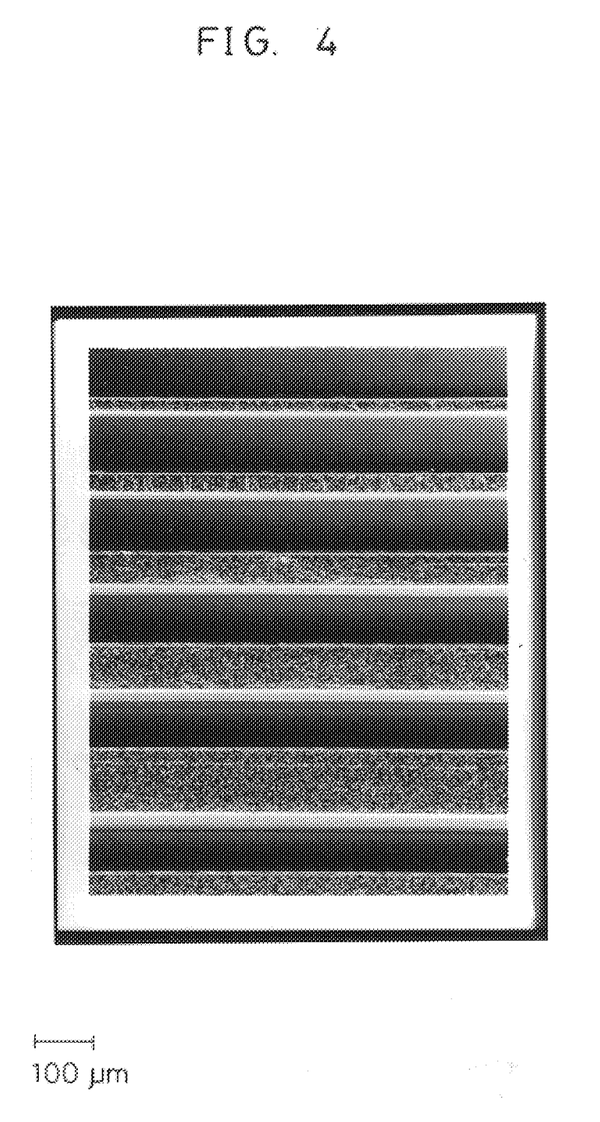
FIG. 4 shows one example of the surface photomicrograph after selective growth according to a conventional process.
Figure 5:
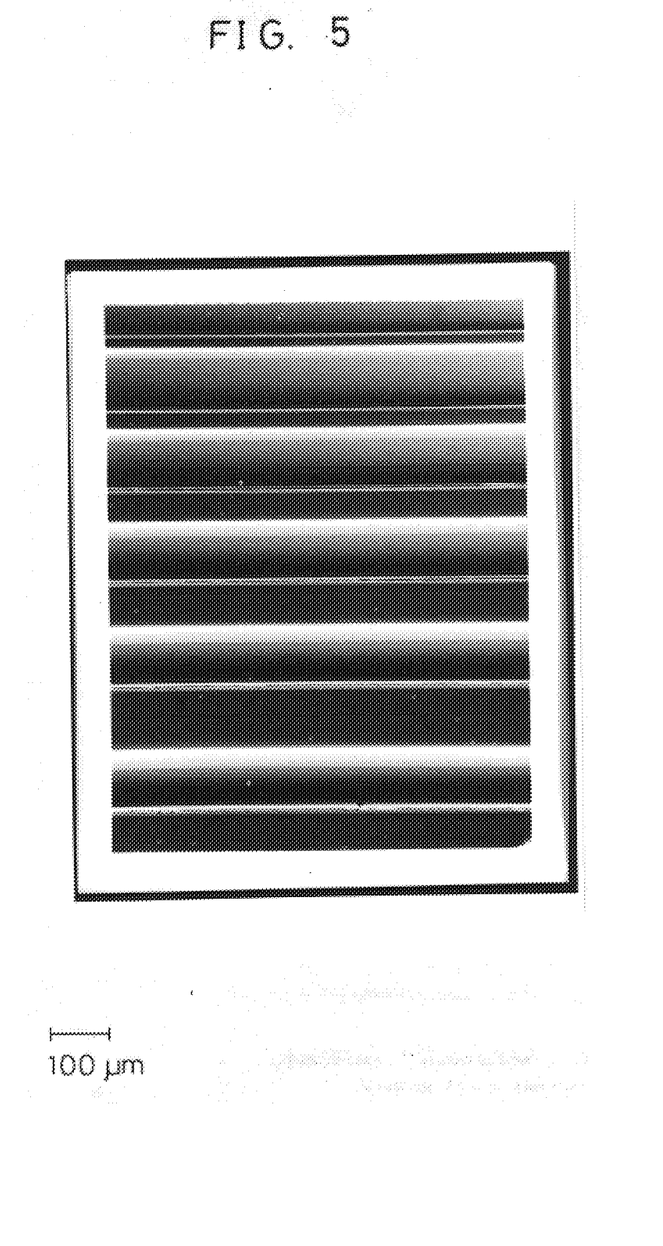
FIG. 5 shows one example of the surface photomicrograph after selective growth according to the process of the invention.

A GaAs substrate was provided thereon with a stripe pattern made up of SiNx films arranged at varying widths (3 $\mu$m to 200 $\mu$m) every 100 $\mu$m, as shown in FIG. 3, and an $Al_{0.5}Ga_{0.5}As$ layer or an AlAs layer, each of about 1 $\mu$m in thickness, was grown on the substrate by the MOVPE technique. The then used feed gases were trimethylgallium (TMG), trimethylaluminum (TMA) and arsine ($AsH_3$). The numbers of moles of TMG and TMA fed were respectively 4.8 to 9.6×10$^{-5}$ mol/min respectively and 1.8 to 3.6×10$^{-5}$ mol/min, and the flow rate of AsH$_3$ (diluted with 10% H$_2$) was 800 sccm. The total flow rate was 7.7 SLM, the growth temperature 750° C., the pressure 76 Torr and the growth rate about 2 μm/h. Under the above growth conditions, 1 cc of HCl was added to the reaction atmosphere during the growth to prepare Sample (C), and Sample (D) was prepared according to a conventional growth process making no use of HCl. Optical micrographs taken of the surfaces of the wafers after the growth are presented in the form of FIGS. 4 (Sample (D)) and 5 (Sample (C)). Under the above growth conditions, a growth rate reduction by the addition of 1cc of HCl was 5%. As can be seen from FIG. 4, a thick layer of polycrystal deposits is built up even over the narrow SiNx film stripe (of 3 mm in width) of Sample (D) having the Al$_{0.5}$Ga$_{0.5}$As layer grown thereon. It has been reported about conventional MOVPE techniques that some considerable difficulty is involved in the selective growth of an Al composition having an Al content of 0.35 or more, even when it is carried out at a reduced pressure of a few tens Torr, because the migration length of the Al-containing compound is considerably short. This, too, holds well for Sample (D) prepared by a conventional process.

Figure 6:
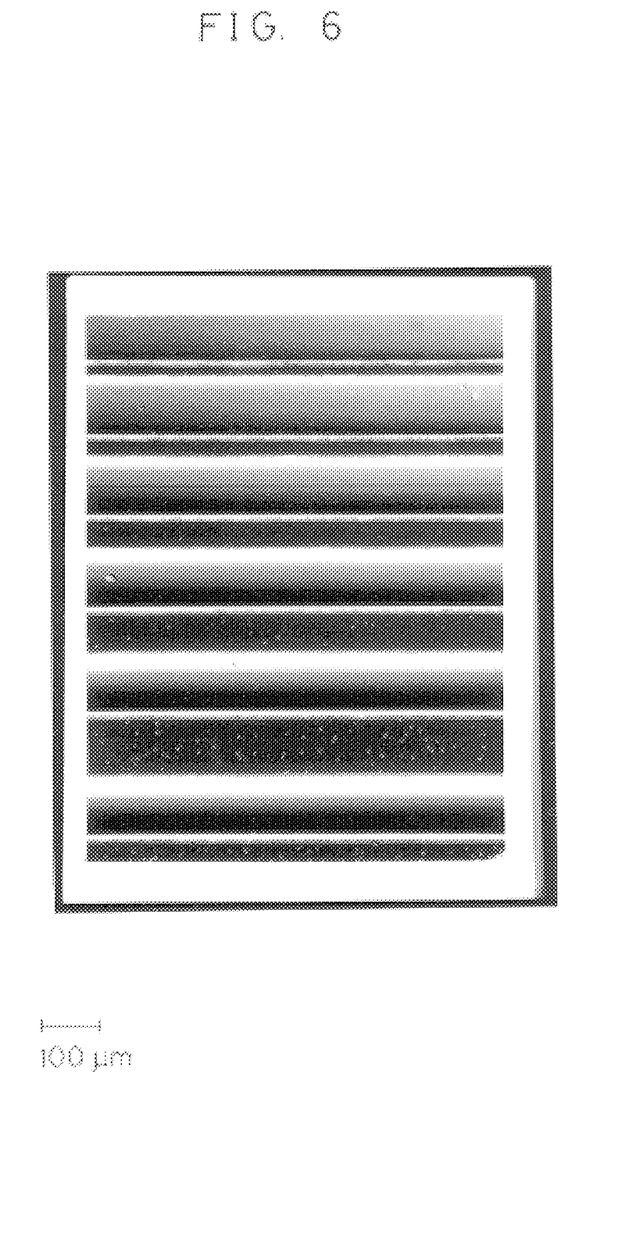
FIG. 6 shows another example of the surface photomicrograph after selective growth according to the process of the invention.

In the case of Sample (C) prepared by the fabrication process of the invention with the Al$_{0.5}$Ga$_{0.5}$As layer formed thereon, on the other hand, no polycrystal deposition is found even over the 200-μm-wide SiNx film stripe, as can be seen from FIG. 5. In the case of another Sample (C) with the AlAs layer formed thereon, only a few polycrystals are scattered over the 80-μm-wide SiNx film stripe, as can be seen from FIG. 6. From this, it is presumed that the migration of the Al-containing compound is accelerated by the addition of HCl, enabling its selective growth to be well done.

Example 3

About a 1-μm-thick Al$_x$Ga$_{1-x}$A was grown on a (100) GaAs substrate at a varying Al proportion (X$_{Al}$) by MOVPE. The then used supplied gases were trimethylgallium (TMG), trimethylaluminum (TMA) and arsine (AsH$_3$). The molar flow rates of TMG and TMA fed were 4.8 to 9.6×10$^{-5}$ mol/min and 1.8 to 3.6×10$^{-5}$ mol/min respectively, and the flow rate of 10% ASH$_3$ (diluted with H$_2$) was 800 sccm. The dopant used was disilane (Si$_2$H$_6$), which was added to the reaction atmosphere such that the carrier concentration came under the range of 5.0–10.0×10$^{17}$ cm$^{-3}$ in the absence of HCl. The total flow rate was 7.7 SLM, the growth temperature 750° C., the growth pressure 76 Torr and the growth rate about 2 μm/h. During the growth, the HCl concentration was varied between 1 and 100 in terms of the molar flow rate ratio with respect to TMA. The results are shown in FIG. 8. At an Al composition of 0.1, there is no appreciable carrier concentration decrease, even when the HCl concentration is increased. At an Al proportion exceeding 0.3, however, the carrier concentration starts to decrease from when the molar flow rate ratio of HCl with respect to TMA exceeds 3.

On the other hand, a (100) GaAs substrate provided with a similar SiNx film stripe pattern as shown in FIG. 3 was subjected to the same growth process. In the absence of HCl, polycrystal deposits on the stripes were found, as the Al proportion increased. In the presence of HCl, however, no deposition of polycrystals was found on the stripes.

INDUSTRIAL APPLICABILITY

According to the invention, a trace amount(s) of a halide gas and/or a halogen gas free from the mother elements of the compound to be grown is added to the reaction atmosphere while a compound semiconductor is growing, as detailed above, thereby making it possible to flatten the heterojunction interface, or to effect the growth of high-quality crystals without deposition of polycrystals on the mask used over a wide range. A few % growth rate decrease occurs by the addition of a trace amount of HCl, but the reproducibility and controllability of conventional MOVPE remain almost intact, providing an effective procedure for industrial exploitation.

What is claimed is:

1. A process for the selective growth fabrication of a thin film form of aluminum-containing Group III–V compound semiconductor using a halogen element-free hydride and a halogen element-free organic metal, characterized in that a halide gas and/or a halogen gas that are free from the mother elements of the compound to be grown are added to the reaction atmosphere at a flow rate that permits the selective growth to be maintained, while the compound is growing, wherein a protective film is used to effect said selective growth, and deposition of polycrystals on said protective film is inhibited by said halide gas and/or halogen gas.

2. A process according to claim 1, wherein a trimethyl gallium is used to grow the thin form of compound semiconductor of elements of Groups III–V.

3. A process according to claim 1 or 2, wherein an aluminum-containing organic metal is used to grow the thin film form of compound semiconductor of elements of Groups III–V.

4. A process according to claim 3, wherein the aluminum-containing organic metal is a trialkylaluminum, the growth takes place at a temperature of 500° C. to 800° C., and the halide gas and/or halogen gas that are free from the mother elements of the compound to be grown are hydrogen chloride gas.

5. A process according to claim 3 or 4, wherein the molar ratio of trialkylaluminum to hydrogen chloride R, is up to 100.

6. A process according to claim 5, wherein the molar ratio of hydrogen chloride to trialkylaluminum R, and the molar ratio, X$_{Al}$, of aluminum in the elements of Group III in the aluminum-containing compounds of elements of Groups III–V conform to the following formulae:

when $0 < X_{Al} \leq 0.2$, $R \leq 100$; or when $0.2 < X_{Al} \leq 0.4$, $R \leq 50$; or when $0.4 < X_{Al} \leq 1$, $R < 10$.

7. A compound semiconductor fabricated using the process according to claim 1.

8. A process for forming a quantum well heterostructure by vapor-phase growth of a III–V compound semiconductor thin film using a halogen element-free hydride and a halogen element-free organic metal as raw materials to be grown, wherein the III–V compound semiconductor thin film is grown while a halide gas and/or a halogen gas free from mother elements of the compounds to be grown is added to a reaction atmosphere.

9. A process for forming a quantum well heterostructure according to claim 8, characterized in that the quantum well heterostructure comprises two barrier layers and a quantum well layer sandwiched therebetween.

10. A process for forming a quantum well heterostructure according to claim 8, characterized by growth of an aluminum-containing III–V compound semiconductor thin film.

11. A process for forming a quantum well heterostructure according to claim 10, characterized by use of an aluminum-containing organic metal.

12. A process for forming a quantum well heterostructure according to claim 11, characterized in that the aluminum-containing organic metal is a trialkylaluminum and the halide gas is a hydrogen chloride gas, with a growth temperature of 500° to 800° C.

13. A process for forming a quantum well heterostructure according to claim 12, characterized in that a molar ratio, R, of the hydrogen chloride gas and the trialkylaluminum is in the range of R≦100.

14. A process for forming a quantum well heterostructure according to claim 13, characterized in that the molar ratio, R, of the trialkylaluminum and the hydrogen chloride gas, and a molar ratio, $X_{Al}$, of aluminum in the aluminum-containing III–V compound satisfy the following relations:

$1 \leq R \leq 100$, when $0 < X_{Al} \leq 0.2$, $1 \leq R \leq 50$, when $0.2 < X_{Al} \leq 0.4$, $1 \leq R \leq 10$, when $0.4 < X_{Al} \leq 1$.

15. A process for forming a quantum well heterostructure according to any one of claims 8 to 14, characterized in-that the growth rate of said semiconductor thin film is decreased when compared with a process where the halide gas and/or the halogen gas are not added to the reaction atmosphere.

* * * * *